United States Patent [19]
Mattila et al.

[11] Patent Number: 5,446,422
[45] Date of Patent: Aug. 29, 1995

[54] DUAL MODE FM AND DQPSK MODULATOR

[75] Inventors: Heikki Mattila; Jorma Matero; Jaakko Hulkko, all of Oulu, Finland

[73] Assignee: Mokia Mobile Phones Ltd., Salo, Finland

[21] Appl. No.: 305,584

[22] Filed: Sep. 14, 1994

Related U.S. Application Data

[62] Division of Ser. No. 52,335, Apr. 23, 1993, Pat. No. 5,392,460.

[51] Int. Cl.$^6$ ............... H04L 27/12; H04L 27/20
[52] U.S. Cl. ................... 332/103; 332/105; 332/119; 375/216; 375/283
[58] Field of Search ............ 332/103, 104, 105, 119; 375/5, 52, 56, 57

[56] References Cited

U.S. PATENT DOCUMENTS

| | | | |
|---|---|---|---|
| 5,020,076 | 5/1991 | Cahill et al. | 375/5 |
| 5,124,672 | 6/1992 | Kuisma | 332/103 |
| 5,228,074 | 7/1993 | Mizikovsky | 379/59 |

FOREIGN PATENT DOCUMENTS 0170324  2/1986  European Pat. Off. .

OTHER PUBLICATIONS

Product Brochure, "ICs For Communications, GSM Transmitter Circuit PBM 2200", Siemens, Ed. 5.90 (1990).

*Primary Examiner*—Seigfried H. Grimm
*Attorney, Agent, or Firm*—Perman & Green

[57] ABSTRACT

A dual-mode radiotelephone terminal includes a π/4-shift DQPSK modulator (11). A dual-mode modulation is achieved by mixing an output of a transmitter oscillator (16) with an output of an offset oscillator (18) to form an injection signal (LO) at a final transmitter frequency, the injection signal being further modulated with a quadrature modulator in a digital mode of operation. In an analog mode of operation the transmitter oscillator or the offset oscillator is frequency modulated and the quadrature modulator is disabled with a bias signal, thereby passing the frequency modulated injection signal without substantial attenuation. The LO signal is regenerated and also phase shifted with a circuit (35) having a frequency multiplier (30) and a frequency divider (34). The circuit outputs two local oscillator (LO) signals (LOA and LOB), each of which directly drives an associated quadrature mixer (36, 38) of the modulator. A control signal is employed for selectively enabling and disabling various of these components as a function of the operating mode, thereby conserving power.

3 Claims, 6 Drawing Sheets

DUAL MODE FM AND DQPSK MODULATOR

This is a divisional of copending application(s) Ser. No. 08/052,335 filed on Apr. 23, 1993 and now U.S. Pat. No. 5,392,460.

FIELD OF THE INVENTION

This invention relates generally to radiotelephones and, in particular, to cellular mobile telephones that are capable of both analog and digital operation.

BACKGROUND OF THE INVENTION

The operation of a dual mode (analog and digital) cellular mobile telephone system is set forth in an Electronic Industry Association/Telecommunications Industry Association EIA/TIA Interim Standard entitled "Cellular System Dual-Mode Mobile Station-Base Station Compatibility Standard", IS-54-B (April 1992). The dual-mode EIA standard IS-54-B has features found in the conventional analog Advanced Mobile Phone Service AMPS system and, in addition, digital voice transmission features.

A flexible increase of capacity is provided by dividing existing 30 kHz bandwidth analog channels into a plurality of digital Time Division-Multiple Access (TDMA) channels. As a result, the same cell area can support both analog and digital transmission of voice and control or signalling information. The preferred implementation of the mobile telephone or terminal is a dual operation apparatus which can use analog channels where there is no digital support. In addition, the IS-54-B Interim Standard requires that the mobile terminal gain access to the digital channel through the analog channel. As a result, a dual operation terminal requires all of the functionality of a conventional analog mobile terminal, while also requiring digital functionality for TDMA digital mode operation.

A preferable solution is to integrate these functions as much as possible, and to provide dual-use elements where practical to reduce complexity, weight, power consumption, and cost.

One significant difference between the analog and digital modes of operation is in the required modulation for the transmission of voice and signaling information to a base station that serves a cell within which the terminal is currently located. The conventional analog terminal employs a frequency modulation (FM) of a radio frequency (RF) carrier signal. However, the digital terminal requires the use of a $\pi/4$-shift differential quadrature phase shift keying (DQPSK) modulation technique. These two modulation techniques are generally incompatible with one another.

One approach to providing a dual-use modulator is disclosed in commonly assigned U.S. Pat. No. 5,124,672 (E. J. Kuisma). In this approach, analog or digital signals are applied to in-phase (I) and quadrature (Q) generators to form I,Q waveshapes which modulate an intermediate frequency and, upon summation, modulate a transmission frequency.

Another problem that is encountered when providing a dual-mode mobile terminal relates to the receiver circuitry. In general, when receiving an analog FM modulated transmission a second IF frequency of several hundred kHz is employed, in conjunction with an FM discriminator. However, when receiving a digital $\pi/4$ shift DQPSK modulated transmission a second IF frequency of several MHz is employed, in conjunction with a suitable DQPSK demodulator. As a result of these significantly different receiver and demodulator requirements, it is difficult to reduce receiver circuit complexity, redundancy and power consumption.

OBJECTS OF THE INVENTION

It is thus an object of this invention to provide a dual-mode radiotelephone terminal that overcomes the problems of the prior art.

It is a further object of this invention to provide a dual-mode modulator that employs a digital phase shift element having outputs for driving both of the mixers of a $\pi/4$-shift DQPSK modulator, wherein in the analog mode of operation the output signals of the digital phase shift element are frequency modulated.

It is a still further object of the invention to provide a dual-mode receiver that provides an efficient re-use of circuitry, and that provides a capability to achieve low power operation.

SUMMARY OF THE INVENTION

The foregoing and other problems are overcome and the objects of the invention are realized by a dual-mode $\pi/4$-shift DQPSK modulator for use in a transmitter of a radiotelephone. A dual-mode modulation approach is employed where, in one embodiment, an output of a transmitter oscillator is mixed with the output of an offset oscillator to form the injection signal at a final transmitter frequency, the injection signal being further modulated with a quadrature modulator. In the analog mode of operation the transmitter oscillator is frequency modulated and the quadrature modulator is disabled, thereby passing the frequency modulated injection signal without substantial attenuation. In the digital mode of operation the frequency modulation of the transmitter oscillator input is disabled and the I/Q modulator is enabled. The transmitter injection frequency signal is regenerated and also phase shifted with a circuit having a frequency multiplier and a frequency divider. The circuit outputs two local oscillator (LO) signals (LOA and LOB), each of which directly drives an associated quadrature mixer of the modulator.

In a further embodiment of the invention the outputs of a VHF synthesizer and a UHF synthesizer are mixed together to form the transmitter injection frequency signal. In the analog mode of operation the output of the VHF synthesizer is frequency modulated in accordance with voice or signalling information.

The foregoing and other problems are overcome and the objects of the invention are further realized by a dual-mode radiotelephone terminal that includes a VHF synthesizer, a UHF synthesizer, and a local oscillator that provides a signal only when operating in the analog receiving mode. The local oscillator signal is mixed with a first IF signal for providing a second IF signal when operating in the analog receiving mode or in a standby mode. The first IF frequency is provided by a standard IF filter (45 MHz) when operating in either the digital or the analog mode of operation. The output of the VHF synthesizer is divided and used as an input to a mixer that provides a second IF signal when operating in the digital receiving mode. A control signal is employed for selectively enabling and disabling various of these components as a function of the operating mode, thereby conserving power.

BRIEF DESCRIPTION OF THE DRAWING

The above set forth and other features of the invention are made more apparent in the ensuing Detailed Description of the Invention when read in conjunction with the attached Drawing, wherein:

FIG. 3a is a block diagram of an embodiment of a digital phase shifter that directly drives the I/Q mixers of an I/Q modulator in accordance with the invention;

FIG. 3b illustrates the waveforms of the 90° phase shifted signals that are generated by the digital phase shifter of FIG. 3a;

DETAILED DESCRIPTION OF THE INVENTION

A first described embodiment of this invention provides modulation in both an analog and a digital mode of operation (dual-mode) of a cellular radiotelephone terminal, referred to hereinafter as a mobile terminal.

Figure 1:
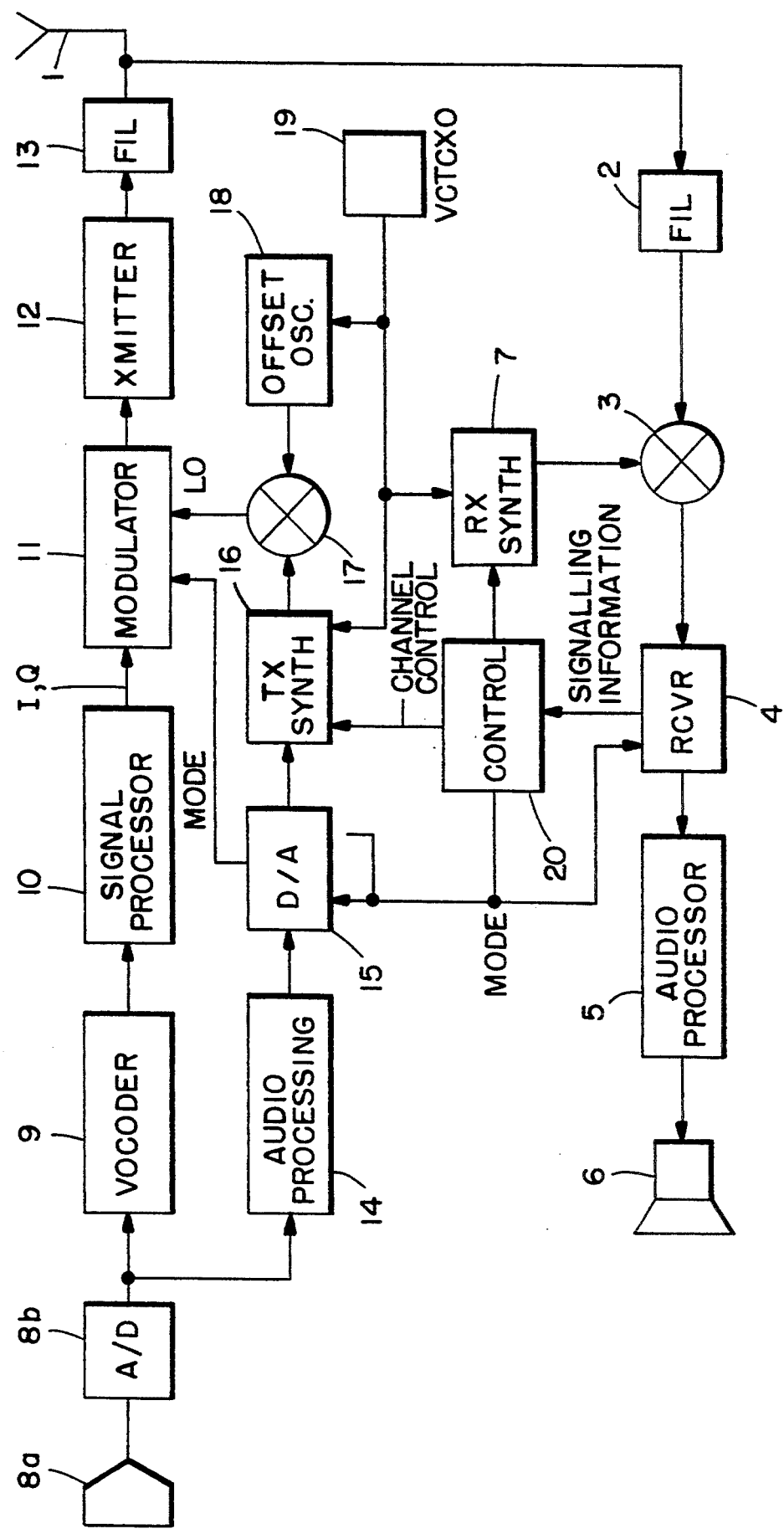
FIG. 1 is a block diagram of one embodiment of a radiotelephone that is constructed in accordance with the invention.

FIG. 1 illustrates a block diagram of a dual-mode mobile terminal that is constructed in accordance with the invention. An antenna (1) receives a signal from a base station (not shown). The received signal has a center frequency of 885 MHz. The received signal is fed through a bandpass filter (2) to a mixer (3). The receiver's first local oscillator signal is generated with an RX-synthesizer (7) which is tuned above the received frequency by an amount equal to, by example, 45 MHz. The receiver block (4) demodulates and processes the received/signal and provides the processed received signal to an audio processing block (5). The required audio processing is accomplished digitally or in an analog manner, depending on the operating mode. The output of the audio processor 5 drives a loudspeaker (6) whereby a user is enabled to hear the speech of another party during a conversation.

Having described the receiving side, a description is now given of the transmitting side of the dual-mode mobile terminal. A voice signal is fed from a microphone (8a) to an analog to digital (A/D) converter (8a) and thence to a vocoder (9), in the digital mode, or to an audio processing block (14) for audio shaping and companding in the analog mode. After audio processing, the analog signal is fed to a digital to analog converter (D/A) (15) for conversion back to an analog signal. The analog output of the D/A converter (15) is controlled by a controller (20), preferably implemented as a microprocessor that operates under a control program. In the digital mode of operation the controller (20) causes the output signal from the D/A converter (15) to assume a predetermined level, or to be switched out and replaced by a predetermined potential. In the analog mode of operation the controller (20) causes the output of the D/A converter (15) to be coupled to the input of a programmable oscillator of a transmitter synthesizer (Tx SYNTH) (16). That is, the output frequency of the TX-synthesizer (16) is varied in accordance with the input audio signal, thereby achieving a frequency modulation of the TX-synthesizer (16) output frequency. The controller (20) also operates to frequency modulate the TX-synthesizer (16) output frequency in accordance with signalling information to be transmitted. The TX-synthesizer (16) output frequency is also controlled to achieve channel switching.

The output frequency of/the TX-synthesizer (16) is applied to a mixer (17) wherein it is mixed with the output of an offset oscillator (18) to generate a transmitter injection signal (LO) at the final transmitter frequency (840 Mhz). The offset oscillator (18) is typically set to 90 Mhz. A further oscillator (VCTCXO) (19) provides a synchronizing frequency to the RX SYNTH (7), the TX SYNTH (16), and the offset oscillator (18). As an example, a suitable output frequency for the VCTCXO (19) is 19.44 MHz.

It should be realized that the exact frequencies of the transmitter and receiver synthesizers (7) and (16) and the offset oscillator (18) are adjustable according to application specific requirements. The values given above are suitable for use in the dual-mode Interim Standard specified in IS-54-B, and are not intended to be read in a limiting sense upon the practice of the invention. Furthermore, it should be realized that some components of the mobile terminal are not shown in FIG. 1, such as a keypad for entering telephone numbers, etc. These other components operate in a conventional fashion, and are not germane to an understanding of the invention.

In the digital mode of operation the vocoded digital signal is further processed in a signal processing block (10) and fed to a dual-mode modulator (11) that operates in accordance with the invention. The transmitter injection signal (LO) is also input to the dual-mode modulator (11). After I/Q modulation, the transmitter signal is amplified in a transmitter block (12) and fed to a bandpass filter (13) for removing spurious signals. The filtered transmitter signal is then fed to the antenna (1) for transmission, typically, to the base station that serves the cell within which the mobile terminal is located.

The analog/digital modulation mode is controlled automatically by microprocessor (20), in accordance with received signalling information, through the use of a MODE signal. The MODE signal may disable the microphone signal path during digital mode by disabling the D/A converter (15), such as by placing the D/A converter (15) in a low-power mode to conserve battery power. The MODE signal is also applied to the dual-mode modulator 11 for disabling either or both of the I signal path or the Q signal path during the analog mode of operation.

In a conventional π/4-shift DQPSK modulator the I and Q cosine and sine signals are the orthogonal quadrature components at the baseband frequency. I and Q signals are fed through low pass filters to associated mixers. The transmit carrier frequency (LO) is fed through an amplifier to phaseshift networks(+, −45° or one 90°) and thereafter to the mixers. The output signals from the mixers are combined by an adder and thereafter fed through a bandpass filter to an amplifier, thereby producing an amplified modulated output signal. The conventional modulation technique uses the mixers to attenuate the carrier LO signal and reduce the leakage of carrier in the digital mode.

Figures 3A, 3B:
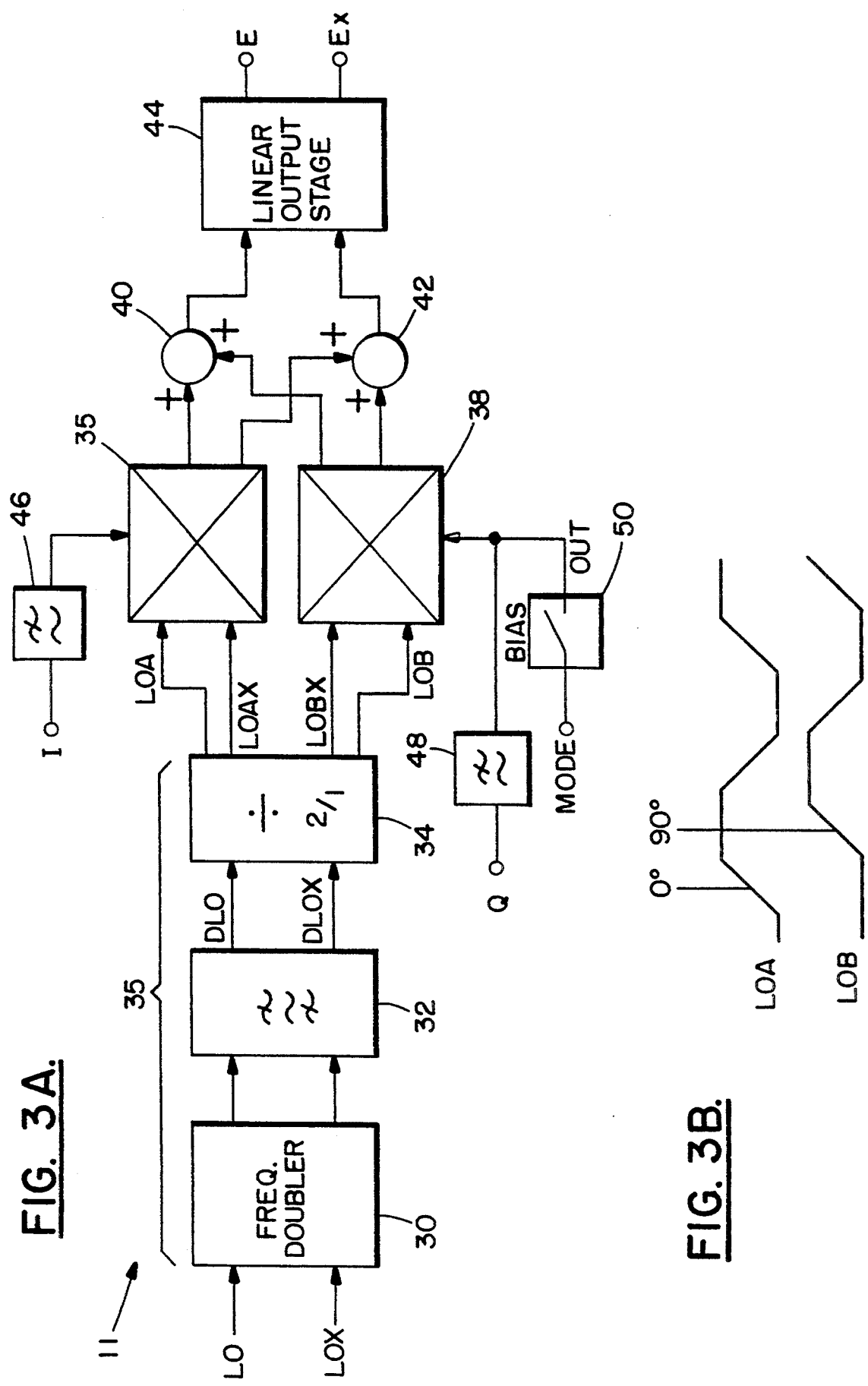

FIG. 3a illustrates a first embodiment of the dual-mode modulator (11) according to the present invention. Differential LO signals (LO and LOX) are applied to a frequency doubler (30) which converts the LO signal to a frequency of approximately 1.8 GHz. This frequency is filtered at block (32) and applied to a divide by 2 frequency divider (34). Divider (34) provides first and second 900 Mhz LO outputs (LOA and LOB) and their respective differential signals (LOAX and LOBX). Divider (34) can contain a pair of high speed flipflops (FF1 and FF2). FF1 is clocked with the rising edge of LO and FF2 with the falling edge. Each FF has a D input connected to a Q* output. The LOA and LOB signals are taken from the Q outputs of FF1 and FF2, respectively. Devices (30), (32), and (34) can be seen to regenerate the LO signal and to provide two transmitter injection signals (LOA and LOB) that are offset from one another by a desired phase shift. These devices are referred to collectively as (35) in FIGS. 3a and 6.

FIG. 3b illustrates the phase relationship between signals LOA and LOB. As can be seen, the frequency divider (34) operates to introduce a 90° phase shift between LOA and LOB. LOA is applied to quadrature mixer (36) and LOB is applied to quadrature mixer (38). An aspect of this embodiment of the invention is the balancing of the transmitter injection frequency signal power at the inputs to the mixers (36) and (38), and a reduction in a required drive requirement of the mixer (17).

Other advantages that accrue from this embodiment of the invention include the following. First, the LO input signal may vary over a considerable range without affecting the output signal level of the mixers (36) and (38). Second, an accurate 90° phase shift is achieved without the use of adjustments or the use of expensive, high-tolerance components. Thirdly, the signals are proportional to one another, the balanced output is less sensitive to noise, and the implementation is more readily fabricated in an integrated circuit form. Also, a wide range of input frequencies can be accommodated.

Continuing with the description of FIG. 3a, mixer (36) also receives the I phase vector modulation signal via filter (46), while mixer (38) receives the Q phase vector component via filter (48).

In the digital mode the outputs of mixers (36) and (38) are additively combined by nodes (40) and (42) which provide outputs to a linear output stage (44). The phase modulated differential outputs (E and EX) of linear output stage 44 are applied to the transmitter power amplifier (12) of FIG. 1.

Circuitry suitable for implementing the combination of the frequency doubler (30), filter (32), divider (34), mixers (36) and (38), summing nodes (40 and 42), and output stage (44) is available at the time of filing of this patent application in an integrated circuit package manufactured by Siemens AG. The integrated circuit is designated PMB 2200 (GSM Transmitter Circuit) and is described in a Data Book 5.90 (1990) which is available from Siemens AG.

Dual-mode modulator (11) further includes a current bias source (50) that is controlled by the MODE signal. In the digital mode the output of bias source (50) is at a level that does not significantly impact the operation of the Q channel mixer (38), and the LO signal is substantially completely attenuated. In the analog mode the output of the bias source (50) is such as to imbalance the mixers (38) and/or (36), resulting in a significant portion of the LO signal leaking through to the output of the linear stage (44). It will be remembered that in the analog mode the LO signal is frequency modulated with the voice signal or the signalling information. As such, in the analog mode the circuit block (35) operates to provide two LO signals (LOA and LOB), each of which is frequency modulated with the voice or signalling information.

Figure 6:
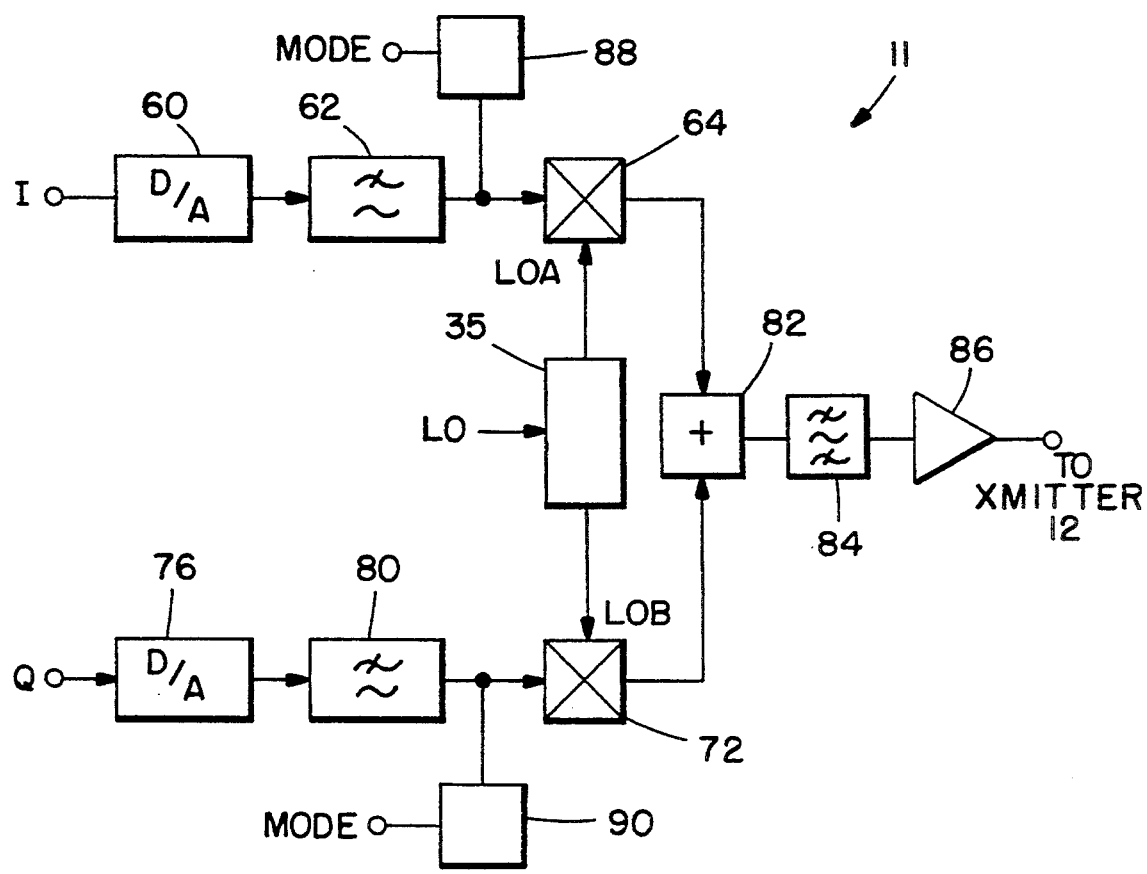
FIG. 6 is a block diagram that illustrates a second embodiment of the transmitter modulator circuitry.

It should be noted that the bias source (50) could be coupled instead to the I channel mixer (36), or could be provided as two components (88, 90) and coupled to both the I channel and the Q channel mixers, as is shown in FIG. 6. In FIG. 6, the I and Q digital signals are converted to analog signals by digital to analog (D/A) converters (60) and (78) and filtered by filters (62) and (80). Mixers (64) and (72) provide outputs at summing node (82) which has an output coupled to an amplifier (86) via bandpass filter (84).

Figure 4:
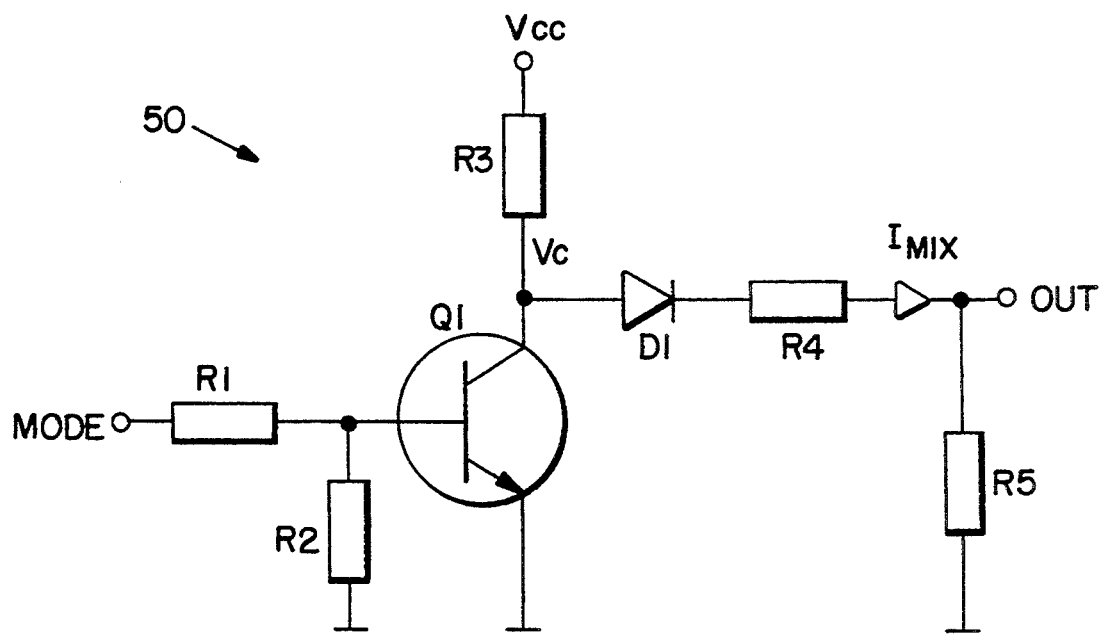
FIG. 4 is a schematic diagram that illustrates a presently preferred embodiment of a circuit for generating an unbalancing bias signal for the I/Q modulator.

FIG. 4 illustrates a presently preferred embodiment of the bias source ( 50 ) . Bias source ( 50 ) includes a transistor (Q1), diode (D1) and four resistors (R1–R4). The load resistance is shown generally as (R5).

In the analog mode the MODE signal is asserted (MODE=0 V and Vc=Vcc) and the output (OUT) of the bias source (50) feeds DC current ($I_{mix}$) through the forward biased (D1) to one of the quadrature mixers (36) or (38). A suitable value for $I_{mix}$ is greater than approximately 30 microamps. Quadrature mixer (36) or (38) will therefore be unbalanced and the carrier LOB will leak through it.

In the digital mode the MODE signal is deasserted (MODE= 5 V and Vc= ~0.3 V). In this case, D1 is reverse biased and operates to limit $I_{mix}$ to a low value. As a result, the quadrature mixers (36) or (38) are not unbalanced and the LOB leakage remains low.

Figure 2:
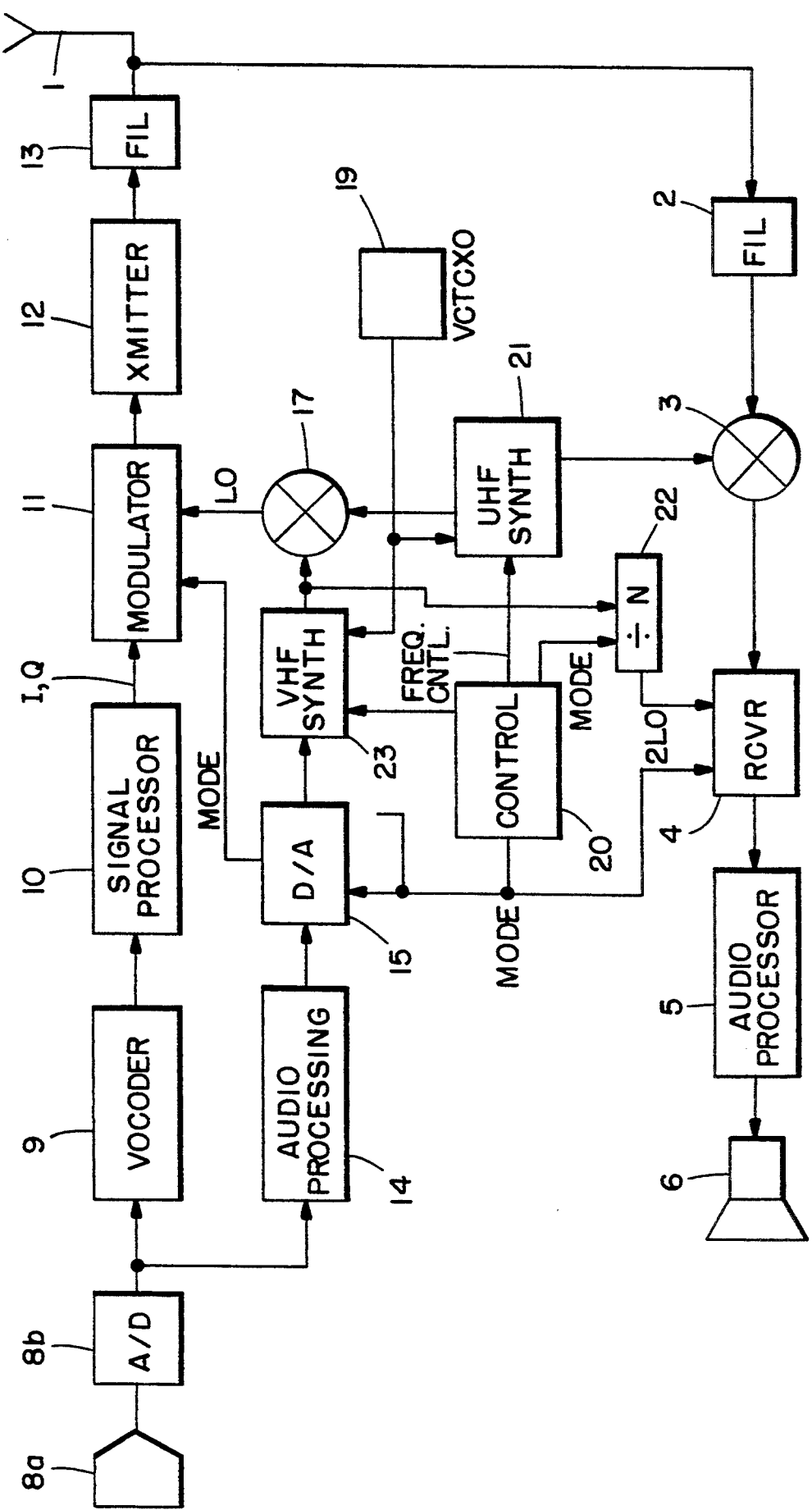
FIG. 2 is a block diagram of a second embodiment of a mobile telephone that is constructed in accordance with the invention.

FIG. 2 illustrates a further embodiment of the invention wherein components found also in FIG. 1 are numbered accordingly. In the embodiment of FIG. 2 only one synthesizer (UHF SYNTH 21) is used to generate the LO signals for both the receiver and transmitter. In addition, a VHF SYNTH ( 23 ) is driven in the analog mode to provide frequency modulation to the LO signal. The output, frequency of the UHF SYNTH (21) and also the VHF SYNTH (23) are each programmable by the controller (20) within a predetermined range and, in general, the output frequency of the UHF SYNTH (21) is approximately ten times that the VHF SYNTH (23).

The output of the VHF SYNTH (23) is applied to a divide by N circuit (22) before application to the RCVR (4) for use as the 2nd LO in the digital mode. In the analog mode the 2nd LO is not used, due to the frequency modulation present in the output of the offset oscillator (18). As such, the MODE signal is coupled to the divider (22) for disabling same when operating in the analog mode.

Figure 5:
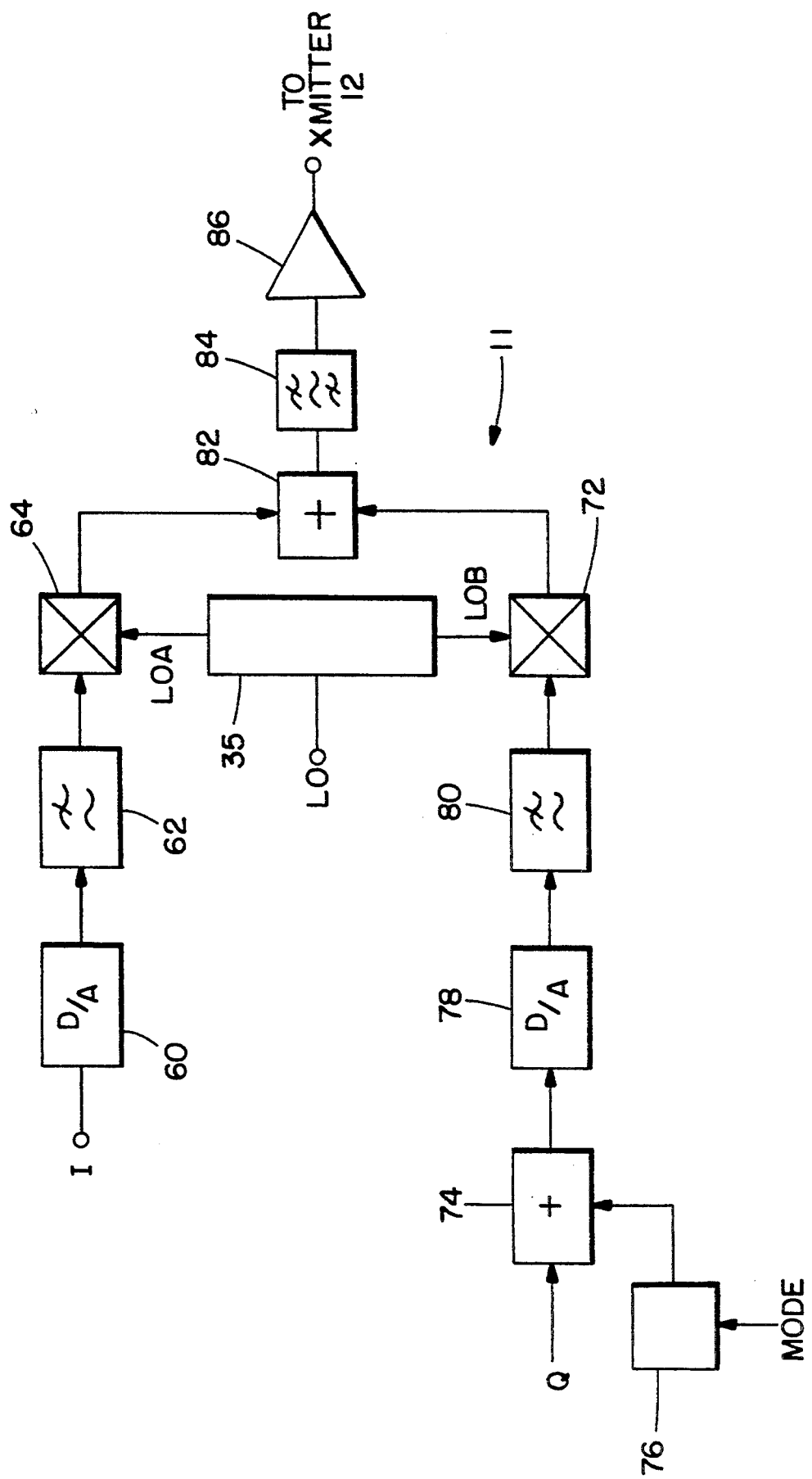
FIG. 5 is a block diagram that illustrates an embodiment of the transmitter modulator circuitry.

FIG. 5 illustrates a further embodiment of the invention wherein the analog mode bias signal is not applied directly to the Q quadrature mixer, but is instead digitally added to the Q phase vector signal. More specifically, a digital bias source (76) applies, under,control of the controller (20), a predetermined digital value to a first input of a digital adder (74). A second input to the adder (74) is the Q vector signal which, in the analog mode of operation, is set to zero. The output of adder (74) is converted to an analog value by D/A converter

(78) before being filtered and applied to the Q quadrature mixer (72).

In the digital mode the value output by source (76) is selected to have no significant effect on the Q phase vector representation. However, in the analog mode the output of the source (76) is sufficiently large to unbalance the mixer (72), causing the frequency modulated LO signal to leak through to the transmitter (12). As before, the source (76) and adder (74) could be employed instead with the I phase vector signal, or with both the I and Q phase vector signals.

Figure 7:
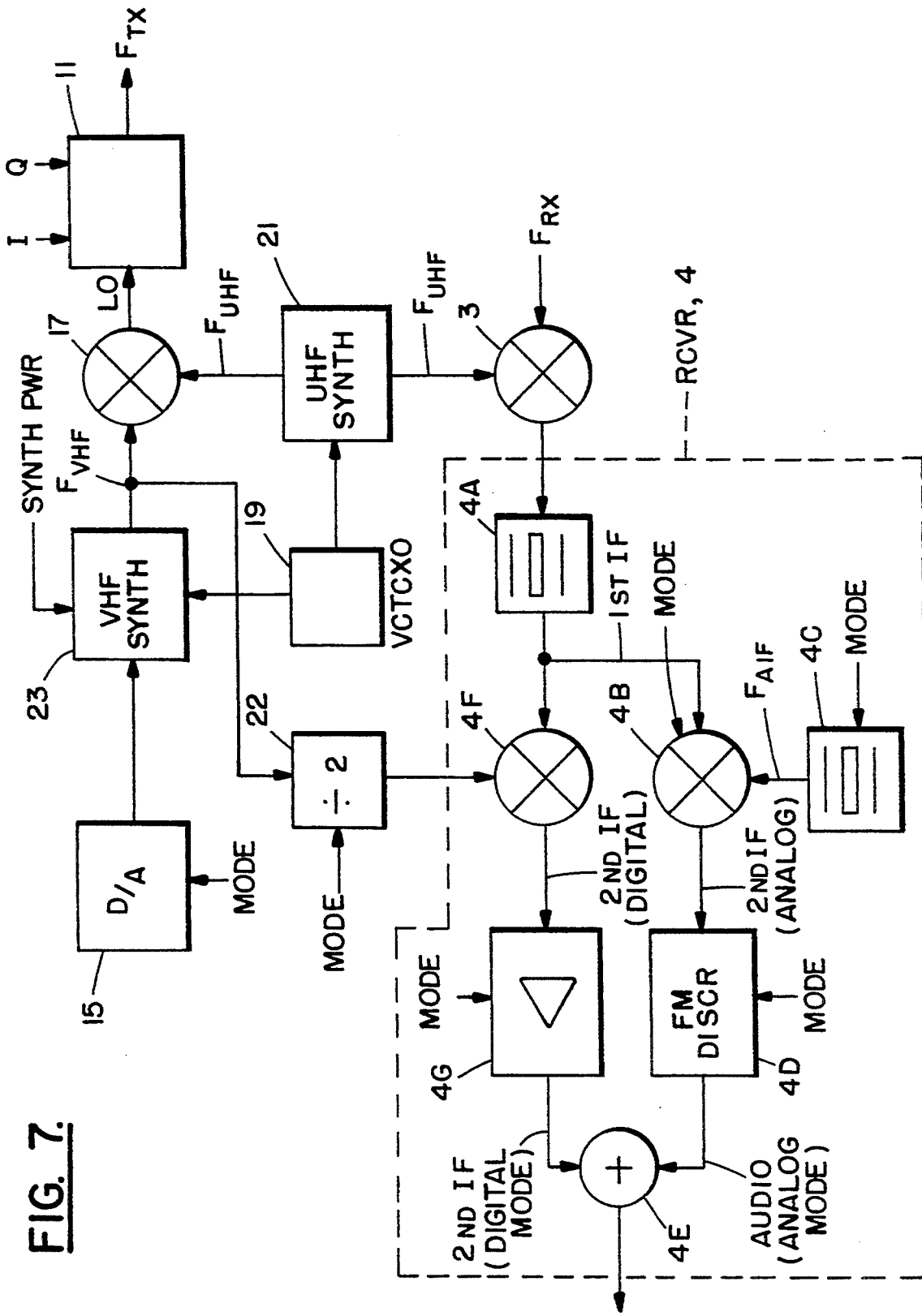
FIG. 7 is a block diagram illustrating an embodiment of a receiver for a dual-mode mobile radiotelephone terminal.

Referring to FIG. 7 there is shown a block diagram of a presently preferred embodiment of the receiver (4) in the embodiment of the mobile terminal shown in FIG. 2.

A feature of this embodiment of the invention is the use of the programmable UHF and VHF synthesizers (21, 23) in conjunction with a standard frequency, low cost first IF filter (4A). Another feature of this embodiment of the invention is the use of a separate analog mode oscillator (4C) which avoids the generation of spurious signals that may disturb the receiver (4). Another, related feature of this embodiment of the invention is the ability to power down the VHF SYNTH 23 in the analog mode of operation to reduce power consumption.

Spurious response is avoided by selecting the UHF and VHF synthesizer frequencies according to the operating mode, analog or digital, and also as a function of whether the mobile terminal is transmitting or receiving. As an example, and for the case where the first IF filter (4A) is a standard, low cost 45 MHz filter, the UHF and VHF SYNTH (21, 23) frequencies, $F_{UHF}$ and $F_{VHF}$ respectively, are selected as indicated in Table 1.

TABLE 1

| | | $F_{UHF}$ (MHz) | $F_{VHF}$ (MHz) |
|---|---|---|---|
| Analog Mode: | Standby | 914–939 | OFF |
| | Tx | 914–939 | 90 |
| | Rx | 914–939 | OFF |
| Digital Mode: | Tx | 918.86–943.86 | 94.86 |
| | Rx | 914–939 | 94.86 |

Analog mode:

The received 869–894 MHz signal ($F_{RX}$) is mixed with the output of the UHF SYNTH (21) in the first mixer (3), the output of which is applied to the 45 MHz first IF filter (4A). The 45 MHz first IF signal is amplified and fed to a second mixer (4B). A second input to mixer (4B) is generated by a 44.545 MHz local oscillator (4C). The difference output signal is a 455 kHz second IF signal that is fed from the second mixer (4B) to an FM-discriminator circuit (4D) which produces the analog mode audio signal.

When receiving in standby mode the VHF SYNTH (23) is switched off by a SYNTH PWR signal. A digital-mode filter and amplifier block (4G) and the divider (22) are switched off by the MODE signal. When transmitting, the VHF SYNTH (23) is turned on, is set to a frequency of 90 MHz, and its output frequency is FM modulated in accordance with the output of D/A (15).

Digital mode:

The first IF signal (45 MHz) is fed to a mixer (4F). The output of the VHF SYNTH (23) is divided by 2 and fed to the mixer (4F) to produce a second IF of 2.43 MHz in the digital mode. The π/4-shift DQPSK modulated output signal from mixer (4F) is filtered and amplified by block (4G) and fed to the digital interface circuit, via combiner (4E), for further processing.

The analog mode local oscillator (4C), mixer (4B), and the FM-demodulator (4D) are switched off by the MODE signal when operating in the digital mode.

While the invention has been particularly shown and described with respect to a number of embodiments thereof, it will be understood by those skilled in the art that changes in form and details may be made therein without departing from the scope and spirit of the invention.

For example, and referring to FIG. 3a, it is within the scope of the invention to generate with the TX SYNTH (16) or the VHF SYNTH (23) the FM modulated LO signal at twice the required frequency, and to thus eliminate the frequency doubler block (30).

As such, the teaching of the invention is not intended to be limited to only the presently preferred embodiments described above, but is instead intended to be given a scope commensurate with the scope of the claims that follow.

What is claimed is:

1. A frequency modulator, comprising:

means for receiving an injection frequency signal and for regenerating the injection frequency signal to provide at a first output a first injection frequency signal and at a second output a second injection frequency signal, said first injection frequency signal having a non-zero phase shift with respect to said second injection frequency signal;

first mixer means having a first input coupled to said first injection frequency signal and a second input coupled to a first modulation control signal, said first mixer means having an output for providing a first output frequency signal that is phase modulated in accordance with said first modulation control signal;

second mixer means having a first input coupled to said second injection frequency signal and a second input coupled to a second modulation control signal, said second mixer means having an output for providing a second output frequency signal that is phase modulated in accordance with said second modulation control signal;

combining means, having a first input coupled to said output of said first mixer means and a second input coupled to said output of said second mixer means, for combining said first and second mixer means outputs into a modulator output signal; and biasing means having a control input for receiving a mode control signal and an output, said output of said biasing means being coupled to at least said first mixer means for selectively enabling said first mixer means, in a first mode of operation indicated by said mode control signal, to output said phase modulated first output frequency signal, said output of said biasing means selectively enabling said first mixer means, in a second mode of operation indicated by said mode control signal, to output a frequency signal that is substantially identical to said first injection frequency signals, said biasing means being comprised of a diode having a first terminal coupled to a transistor switch and a second terminal coupled to at least said first mixer means, said transistor switch having a control terminal coupled to said mode control signal and being responsive to said mode control signal for reverse biasing said diode in the first mode of operation indicated by said mode control signal and for forward biasing said diode in the second mode of operation indicated by said mode control signal, whereby in the second mode of operation said diode conducts a current to at least said first mixer means.

2. A frequency modulator as set forth in claim 1 wherein said means for receiving and regenerating includes:

frequency multiplier means having an input coupled to the injection frequency signal and an output providing an intermediate signal having a frequency that is N times the frequency of the injection frequency signal; and frequency divider means having an input coupled to the intermediate signal and including means for dividing said intermediate signal by N and for providing at said first and second outputs said first and second injection frequency signals, respectively.

3. A frequency modulator as set forth in claim 1 wherein, in said second mode of operation, said injection frequency signal is frequency modulated, and wherein said means for receiving and regenerating includes:

frequency multiplier means having an input coupled to the injection frequency signal and an output providing an intermediate signal having a frequency that is N times the frequency of the frequency modulated injection frequency signal; and frequency divider means having an input coupled to the intermediate signal and including means for dividing said intermediate signal by N and for providing at said first and second outputs said first injection frequency signal, having the frequency modulation, and said second injection frequency signal, also having the frequency modulation.

* * * * *

UNITED STATES PATENT AND TRADEMARK OFFICE
CERTIFICATE OF CORRECTION

PATENT NO. : 5,446,422
DATED : August 29, 1995
INVENTOR(S) : Matilla, H. et al.

It is certified that error appears in the above-identified patent and that said Letters Patent is hereby corrected as shown below:

On the title page of the patent, item number [73], the Assignee should be "Nokia Mobile Phones Ltd., Salo, Finland".

Signed and Sealed this

Fourteenth Day of November, 1995

Attest:

BRUCE LEHMAN

Attesting Officer

Commissioner of Patents and Trademarks